(12) United States Patent
French, Jr.

(10) Patent No.: US 8,976,536 B2
(45) Date of Patent: Mar. 10, 2015

(54) LATCHING CAM HANDLE ASSEMBLY FOR SECURING MATED CIRCUIT BOARDS

(71) Applicant: International Business Machines Corporation, Armonk, NY (US)

(72) Inventor: Michael D. French, Jr., Raleigh, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 224 days.

(21) Appl. No.: 13/859,893

(22) Filed: Apr. 10, 2013

(65) Prior Publication Data

US 2014/0307400 A1     Oct. 16, 2014

(51) Int. Cl.
H05K 5/00     (2006.01)
H05K 7/14     (2006.01)
H05K 5/02     (2006.01)

(52) U.S. Cl.
CPC .............. *H05K 7/1427* (2013.01); *H05K 5/023* (2013.01)
USPC ........... 361/755; 361/754; 361/759; 361/725; 361/679.32; 361/679.4; 312/223.2; 312/244; 455/575.3; 16/221

(58) Field of Classification Search
CPC ......... H05K 5/023; H05K 7/1427; H02B 1/38
USPC ............. 361/679.27, 679.01, 679.58, 679.04, 361/679.28, 679.4, 679.3, 679.53, 679.02, 361/679.31, 679.48, 649.46, 361/679.32–679.33, 754–755, 759, 361/724–725; 312/244, 223.2, 326, 331, 312/34.11–34.12, 209; 16/221; 439/677; 455/575.1, 550, 575.3, 575.2, 556.1, 455/41.2
See application file for complete search history.

(56) References Cited

U.S. PATENT DOCUMENTS

| | | | | |
|---|---|---|---|---|
| 4,331,257 | A * | 5/1982 | Taschner | 220/324 |
| 4,895,231 | A * | 1/1990 | Yamaguchi et al. | 190/115 |
| 4,975,805 | A * | 12/1990 | Schmutzler | 361/754 |
| 5,751,546 | A | 5/1998 | Clark et al. | |
| 5,813,708 | A | 9/1998 | Shen | |
| 6,288,902 | B1 | 9/2001 | Kim et al. | |
| 6,371,326 | B1 * | 4/2002 | Gabele et al. | 220/326 |
| 6,498,731 | B1 | 12/2002 | Roscoe et al. | |

(Continued)

OTHER PUBLICATIONS

IBM TDB, "Self Aligning Electronic Card Enclosure with Cam Latch Handles", ipcom000013221d, Publ date: Nov. 8, 2001, Prior Art Database www.ip.com, pp. 1-5 plus a coversheet.

(Continued)

*Primary Examiner* — Adrian S Wilson
*Assistant Examiner* — Ashishek Rathod
(74) *Attorney, Agent, or Firm* — Katherine S. Brown; Jeffrey L. Streets

(57) ABSTRACT

An apparatus comprises a housing that includes a first housing portion and a second housing portion coupled at a first end. The apparatus further comprises a bulkhead secured to a second end of the second housing portion, and a handle pivotally secured to a second end of the first housing portion. The bulkhead includes a distally extending pin and a spring latch. The handle has a hole that is sized and positioned to selectively receive the distally extending pin and allow the handle to close only with the first and second housing portions in a closed position. The handle also has a hook that is captured by the spring latch in response to the handle being closed. A torsion spring may be used to bias the handle to an open position where the handle can be easily grabbed when the handle has not been latched.

12 Claims, 13 Drawing Sheets

(56) References Cited

U.S. PATENT DOCUMENTS

| | | | |
|---|---|---|---|
| 6,980,427 B2 | 12/2005 | Garnett et al. | |
| 7,029,306 B2 | 4/2006 | Bilcauu et al. | |
| 7,056,156 B1 * | 6/2006 | Hanley et al. | 439/677 |
| 7,264,490 B1 | 9/2007 | Reznikov | |
| 7,352,592 B2 | 4/2008 | Gramse et al. | |
| 7,370,891 B1 * | 5/2008 | Schmitt et al. | 292/113 |
| 7,400,936 B2 * | 7/2008 | Chang | 700/90 |
| 7,589,974 B2 | 9/2009 | Grady et al. | |
| 7,686,619 B2 | 3/2010 | Bell, Jr. et al. | |
| 7,920,386 B2 * | 4/2011 | Tsao et al. | 361/755 |
| 7,946,881 B2 | 5/2011 | Hsieh et al. | |
| 8,289,692 B2 | 10/2012 | Franz et al. | |
| 2004/0178202 A1 * | 9/2004 | Serio, Jr. | 220/324 |
| 2008/0080149 A1 | 4/2008 | Hanna et al. | |
| 2009/0086422 A1 | 4/2009 | McClure et al. | |
| 2009/0279249 A1 * | 11/2009 | Crippen et al. | 361/679.58 |
| 2010/0014223 A1 * | 1/2010 | Chen et al. | 361/679.01 |

OTHER PUBLICATIONS www.planetdj.com, "Odyssey ACP1821 Recessed Spring Loaded Handle", http://www.planetdj.com/i--ACP1821, Jan. 31, 2013, 2 pages.

* cited by examiner

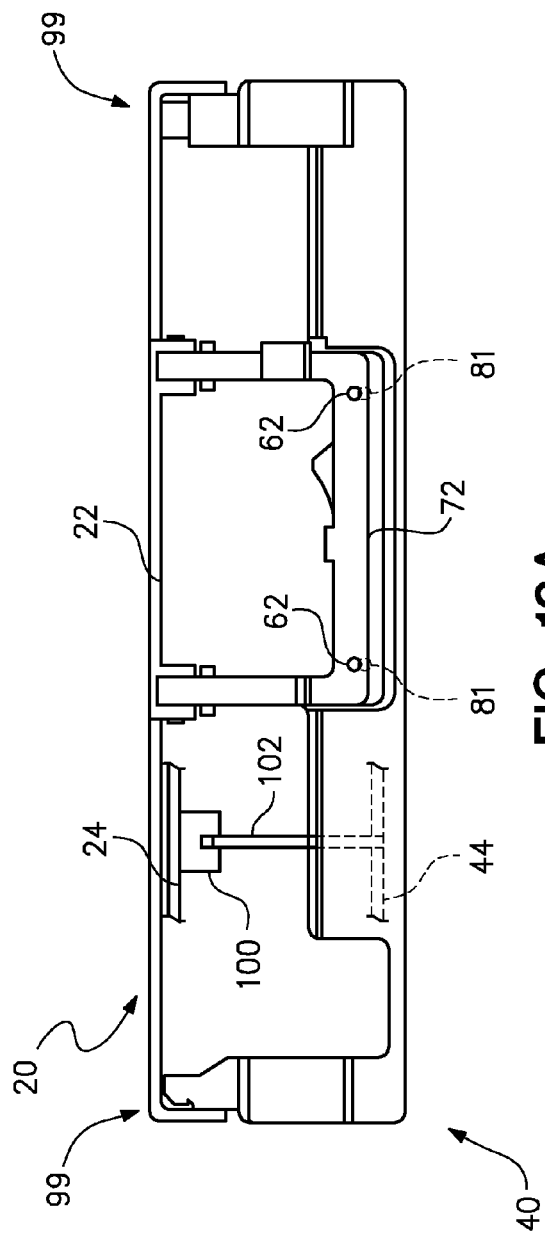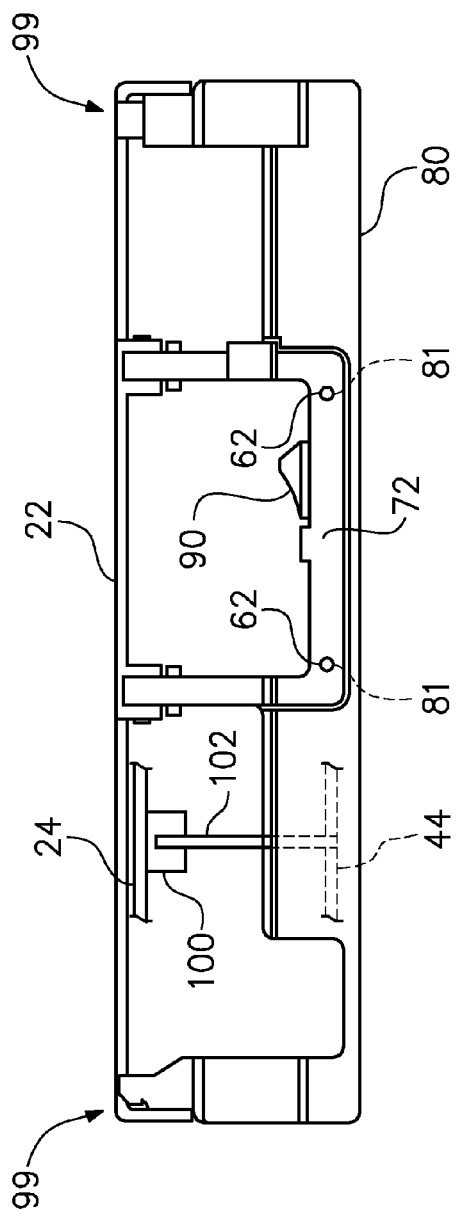

LATCHING CAM HANDLE ASSEMBLY FOR SECURING MATED CIRCUIT BOARDS

BACKGROUND

1. Field of the Invention

The present invention relates to a blade server chassis or housing.

2. Background of the Related Art

There is continual pressure to increase the density of computing devices. Many of the existing resources necessary to operate a computer system or datacenter can be leveraged to support additional capacity if additional computing devices can be configured to fit within the existing chassis, racks and datacenters. While much of this effort relies upon the redesign of individual components, there is much to be gained from redesign of systems to utilize space more efficiently.

Blade servers provide a high density of computing capacity. Each blade includes a separate server, yet the individual server housing is kept small in part because a blade server chassis provides supporting components separate from the server blade. For example, the blade server chassis may include power supplies, fan packs, network switches, a management module, and a midplane for making connections efficiently within the chassis. The blade server chassis may, in turn, be supported in a rack along with other blade server chassis or other computing devices.

While blade servers have become widely accepted and utilized, the continual pressure to increase computing density has led to the development of a double-dense blade server. The idea of a double-dense blade server is to provide two servers in a housing having the same form factor as an existing blade server. In this manner, the installed base of blade server chassis can still be used to support the operation of a double-dense blade server.

BRIEF SUMMARY

One embodiment of the present invention provides an apparatus, comprising a housing, a bulkhead, and a handle. The housing includes a first housing portion and a second housing portion coupled at a first end. The bulkhead is secured to a second end of the second housing portion, wherein the bulkhead includes a distally extending pin and a spring latch. The handle is pivotally secured to a second end of the first housing portion, wherein the handle has a hole that is sized and positioned to selectively receive the distally extending pin and allow the handle to close only with the first and second housing portions in a closed position, and wherein the handle has a hook that is captured by the spring latch in response to the handle being closed.

BRIEF DESCRIPTION OF THE SEVERAL VIEWS OF THE DRAWINGS

FIG. 10A is an elevation view of the housing portions in a nearly-closed position.

FIG. 10B is an elevation view of the housing portions latched in a closed position.

DETAILED DESCRIPTION

Figure 1:
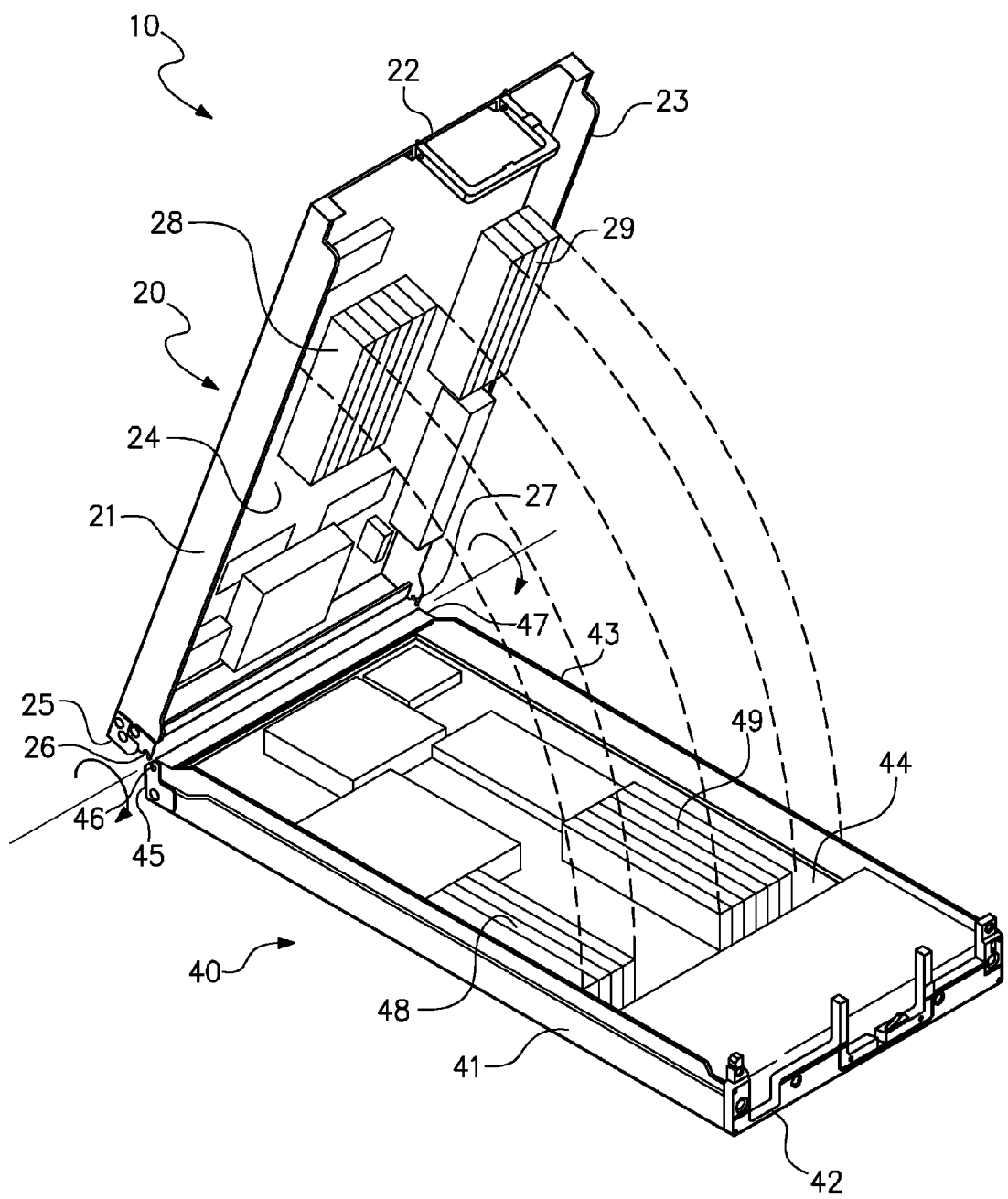
FIG. 1 is a first perspective view of a double dense blade server housing.

One embodiment of the present invention provides a blade server, comprising a first housing portion and a second housing portion. The first housing portion includes a first cover securing a first printed circuit board assembly, first and second sides extending from the first cover, a first bezel portion secured along a proximal end of the first cover between the first and second sides, a first hinge member formed near the proximal end of the first side, and a second hinge member formed near the proximal end of the second side. The second housing portion includes a second cover securing a second printed circuit board assembly, third and fourth sides extending from the second cover, a second bezel portion secured along a proximal end of the second housing portion between the third and fourth sides, a third hinge member formed near the proximal end of the third side, and a fourth hinge member formed near the proximal end of the fourth side. The first and second hinge members are selectively engageable with the third and fourth hinge members to enable the first housing portion to pivot relative to the second housing portion between an open position and a closed position with the first and second printed circuit board assemblies disposed between the first and second housing portions.

In a preferred embodiment, the first and second hinge members are pins establishing a pivot axis, and the third and fourth hinge members are bearing surfaces for selectively receiving the pin.

The first and second hinge members will preferably establish a pivot axis at a position that allows the first and second bezel portions to move apart during initial pivoting of the first housing portion relative to the second housing portion from a closed position toward an open position. This may be further facilitated by first bezel portion having a beveled edge facing the second bezel portion and the second bezel portion having a beveled edge facing the first bezel portion with the first and second hinge members engaged with the third and fourth hinge members. The first and second beveled edges preferably extend distally beyond a pivot axis established by the first and second hinge members.

The blade server may further comprise an electromagnetic compatibility seal secured to the first bezel portion in a position to engage the second bezel portion with the first and second housing portions in the closed position. Furthermore, the first and second housing portions are generally made of sheet metal and the first and second bezels are designed to inhibit the transmission of electromagnetic energy while minimizing impedance to airflow. The electromagnetic compatibility seal may be a compressible material that is positioned to be compressed between the first and second bezels with the first and second housing portions in the closed position. The containment of electromagnetic noise may be further achieved wherein the first and second sides of the first housing portion overlap the first and second sides of the second housing portion with the first and second housing portions in the closed position. The overlapping sides block electromagnetic emission from being emitted or received by the first and second printed circuit board assemblies disposed within the blade server housing.

In another embodiment, at least one component on the first printed circuit board assembly nests with at least one component on the second printed circuit board assembly with the first and second housing portions in the closed position. Nesting or interleaving of a component indicates that components having the greatest height on one printed circuit board are positioned to be offset (out of alignment) from the components on the other printed circuit board that would prevent the two circuit boards from fitting within the blade server form factor. For example, the printed circuit boards (PCBs) in a double-sense blade server may be designed so that closing of the first and second housing portions causes a low profile (LP) dual inline memory module (DIMM) on a first printed circuit board (PCB) to align with an open area on the second PCB. In a separate option, the first printed circuit board assembly may be a first server and the second printed circuit board assembly may be a second server. In an implementation where the first and second servers are the same, the servers may be designed so that the components of an upright server will nest with the components of an inverted server.

In a still further embodiment, the blade server may further comprise a first latch member secured to the distal end of the first housing portion and a second latch member secured to the distal end of the second housing portion, wherein the first latch member is selectively securable to the second latch member with the first and second housing portions in the closed position. Accordingly, the first and second latch members may selectively secure the first and second housing portions in a closed position.

Another embodiment of the present invention provides a method, comprising engaging hinge members on a first housing portion with hinge members on a second housing portion so that the first and second housing portions are pivotally engaged in an open position, wherein the first housing portion includes a first cover securing a first server and a first bezel portion secured along a proximal end of the first housing portion, and wherein the second housing portion includes a second cover securing a second server and a second bezel portion secured along a proximal end of the first housing portion. The method further comprises pivoting the first housing portion relative to the second housing portion about a pivot axis established by the hinge members on the first and second housing portions until the first and second housing portions are in a closed position forming a common housing with the first server facing the second server. The first and second housing portions are then latched in the closed position, and the common housing is installed into a multi-server chassis.

A further embodiment of the invention provides an apparatus comprising a housing that includes a first housing portion and a second housing portion coupled at a first end. The apparatus further comprises a bulkhead secured to a second end of the second housing portion, and a handle pivotally secured to a second end of the first housing portion. The bulkhead includes a distally extending pin and a spring latch. The handle has a hole that is sized and positioned to selectively receive the distally extending pin and allow the handle to close only with the first and second housing portions in a closed position. The handle also has a hook that is captured by the spring latch in response to the handle being closed.

In one embodiment, the apparatus further comprises a first printed circuit board assembly secured to the first housing portion, and a second printed circuit board assembly secured to the second housing portion. Optionally, a first component is secured to the first printed circuit board assembly, wherein the first component has a first conductive connector, and a second component is secured to the second printed circuit board assembly, wherein the second component has a second conductive connector. In accordance with this option, the first conductive connector is aligned for operative engagement with the second conductive connector with the first and second housing portions in a closed position. For example, the conductive connectors may be mezzanine connectors. In a further option, the handle has a cam surface, wherein pivoting the handle from the closed position toward an open position causes the cam surface to engage the bulkhead, move the first and second housing portions out of the closed position, and disengage the first and second conductive connectors.

The apparatus may further comprise a spring biasing the handle toward an open position. The spring preferably keeps the handle from interfering with the closing of the first and second housing portions, yet the spring force is easily overcome by a user to close the close and latch the handle to the bulkhead, and pushes the handle to an user-accessible position when unlatched from the bulkhead.

One non-limiting example of the handle has two arms that are both pivotally secured to the second end of the first housing portion. Such a handle will preferably have a cross member secured between the distal ends of the two arms. Accordingly, the region between the two arms, the second housing member and the cross member should be open for the free flow of exhaust air from the housing.

The spring latch may be slidably received within a slot in the bulkhead. A preferred spring latch includes a finger trigger for retracting the spring latch to release the handle.

In non-limiting embodiments of the present invention, at least one of the first and second printed circuit board assemblies may have a component that is accessible through the second end of the housing for connection with an external component, such as a midplane of a multi-server chassis. The connection is preferably completed by blind-docking the apparatus into a server bay of the multi-server chassis. The component may provide a power connection or a network connection. Furthermore, the first and second printed circuit board assemblies may include multiple components for connecting with external components.

FIG. 1 is a first perspective view of a double dense blade server chassis or housing 10. The housing 10 includes a first housing portion 20 and a second housing portion 40. The first housing portion 20 includes a first cover 22 securing a first printed circuit board assembly 24, a first side 21 and a second side 23 extending from the first cover 22, a first bezel portion 25 secured along a proximal end of the first cover 22 between the first side 21 and the second side 23, a first hinge member 26 formed near the proximal end of the first side 21, and a second hinge member 27 formed near the proximal end of the second side 23. The second housing portion 40 includes a second cover 42 securing a second printed circuit board assembly 44, a third side 41 and a fourth side 43 extending from the second cover 42, a second bezel portion 45 secured along a proximal end of the second cover 42 between the third side 41 and the fourth side 43, a third hinge member 46 formed near the proximal end of the third side 41, and a fourth hinge member 47 formed near the proximal end of the fourth side 43. The first and second hinge members 26, 27 are selectively engageable with the third and fourth hinge members 46, 47 to enable the first housing portion 20 to pivot relative to the second housing portion 40 between an open position (see also FIG. 4) and a closed position (see also FIG. 5) with the first and second printed circuit board assemblies 24, 44 disposed between the first and second housing portions 20, 40.

Although FIG. 1 shows the housing 10 in the open position, the curved dashed lines illustrate that a first DIMM bank 28 and a second DIMM bank 29 on the first printed circuit board assembly 24 are nest with (or are interleaved with) a third DIMM bank 48 and a fourth DIMM bank 49 on the second printed circuit board assembly 44. When the housing is in a closed position, the four DIMM banks will be disposed in an order (from left to right in FIG. 1) of (1) the third DIMM bank 48, (2) the first DIMM bank 28, (3) the fourth DIMM bank 49, and (4) the second DIMM bank 29. Other components on the two printed circuit board assemblies may have a sufficiently low profile that there is no need to nest those components.

Figure 2:
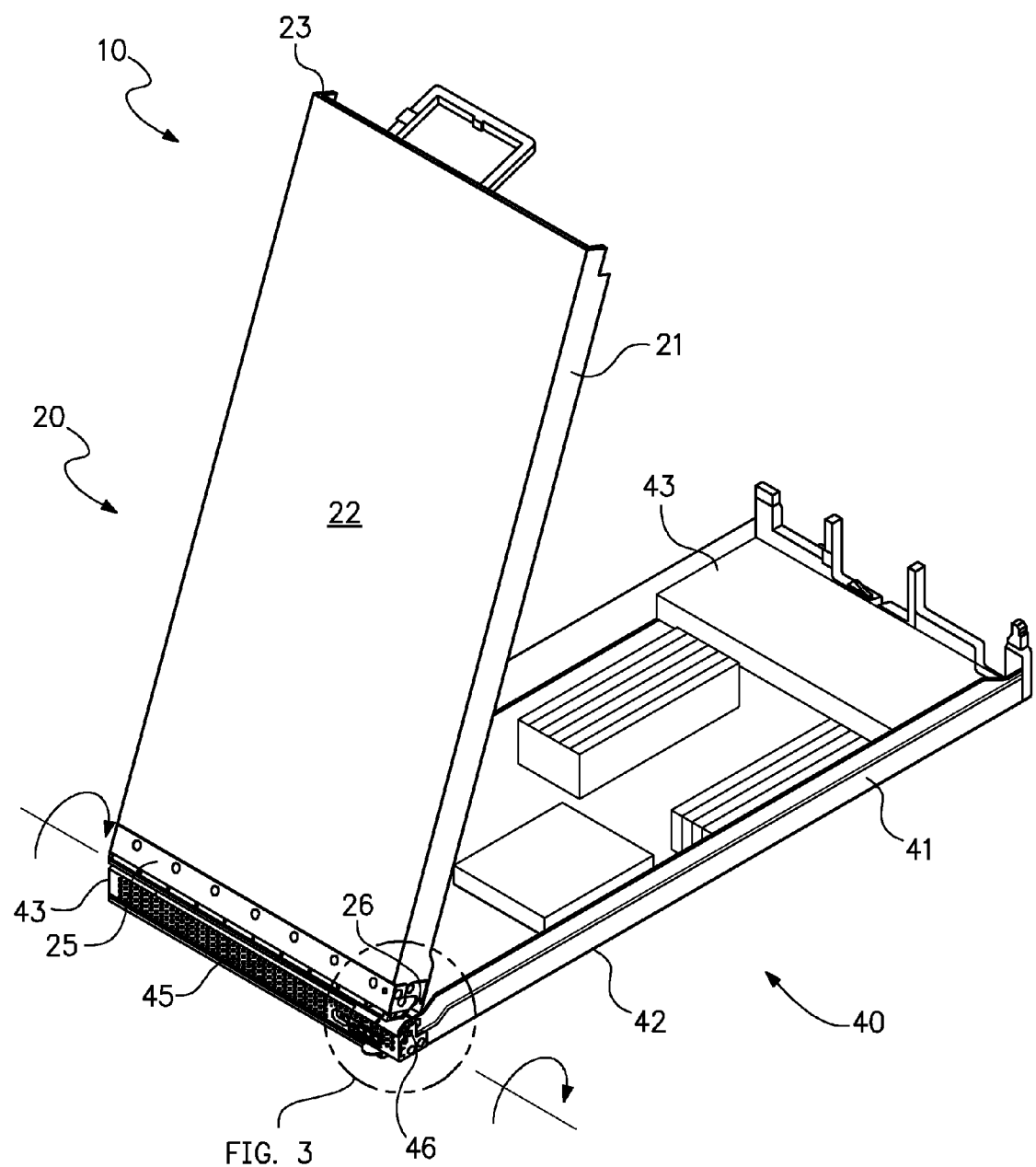
FIG. 2 is a second perspective view of the double dense blade server housing.

FIG. 2 is a second perspective view of the double dense blade server chassis or housing 10. Certain components of the housing 10 have been labeled with reference numbers consistent with FIG. 1 to assist in understanding the invention. For example, the first housing cover 22 is more clearly shown in FIG. 2. Furthermore, the second bezel portion 45 is shown extending across the proximal end of the second housing portion 40 from the third side 41 to the fourth side 43.

Figure 3:
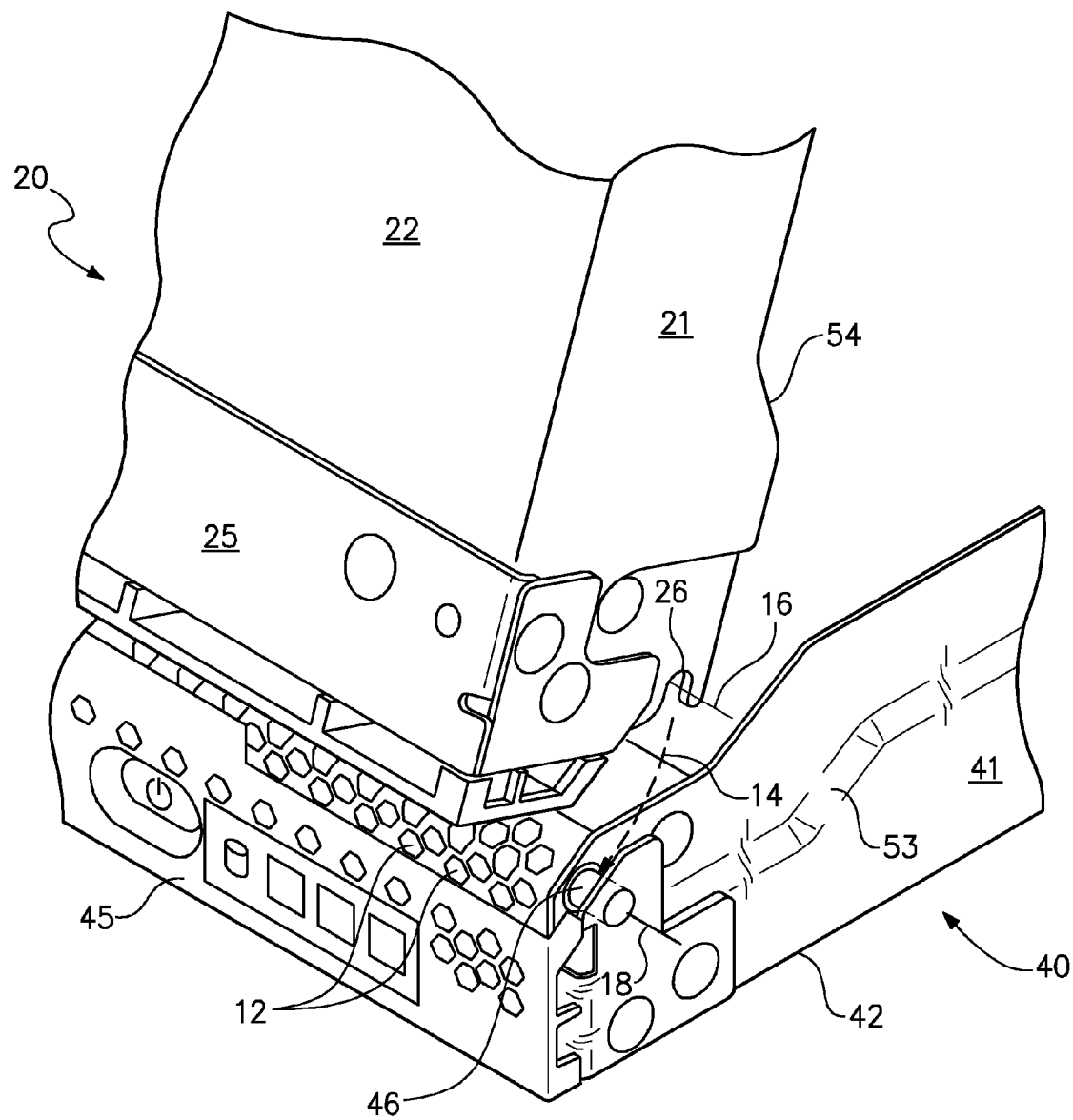
FIG. 3 is a partial perspective view of a proximal end of the first and second housing portions.

FIG. 3 is an enlarged, partial perspective view taken from FIG. 2 to more particularly show the hinge members 26, 46 of the housing. The first housing portion 20 is shown with its cover 22 and the first side 21 extending toward the second housing portion 40, and the second housing portion 40 is shown with its cover 42 and the third side 41 extending toward the first housing portion 20. A first bezel portion 25 is secured to the first housing portion 20 along the proximal end of the first housing cover 22 from the first side 21 to the second side (not shown). Similarly, a second bezel portion 45 is secured to the second housing portion 40 along the proximal end of the second housing cover 42 from the third side 41 to the fourth side (not shown). The first and second bezel portions 25, 45 having perforations 12 across the face of the bezel that form air inlet passages to the housing for the purpose of allowing air to circulate through the housing to cool the processor and other heat generating components in the first and second servers.

The first side 21 of the first housing portion 20 has a hinge member 26 in the form of a bearing member that fits around (or receives) a hinge member 46 in the form of a pin that is part of the third side 41 of the second housing portion 40. The hinge members 27, 47 (not shown) on the opposing side of the housing 10 are minor images of the hinge members 26, 46 and engage in the same manner to pivot about the same axis. The hinge members preferably do not extend across the front of the housing portions, but rather are kept to the respective sides of the housing portions. Still, the first and second hinge members 26, 27 should have a common axis 16, and the third and fourth hinge members 46, 47 should also have a common axis 18. When the first housing portion 20 is moved (in the direction of the arrow 14) so that the first and second hinge members 26, 27 engage and receive the third and fourth hinge members 46, 47, respectively, the two axis 16, 18 will be collinear and the first housing portion 20 will easily pivot relative to the second housing portion 40 about the common pivot axis.

Figure 4:
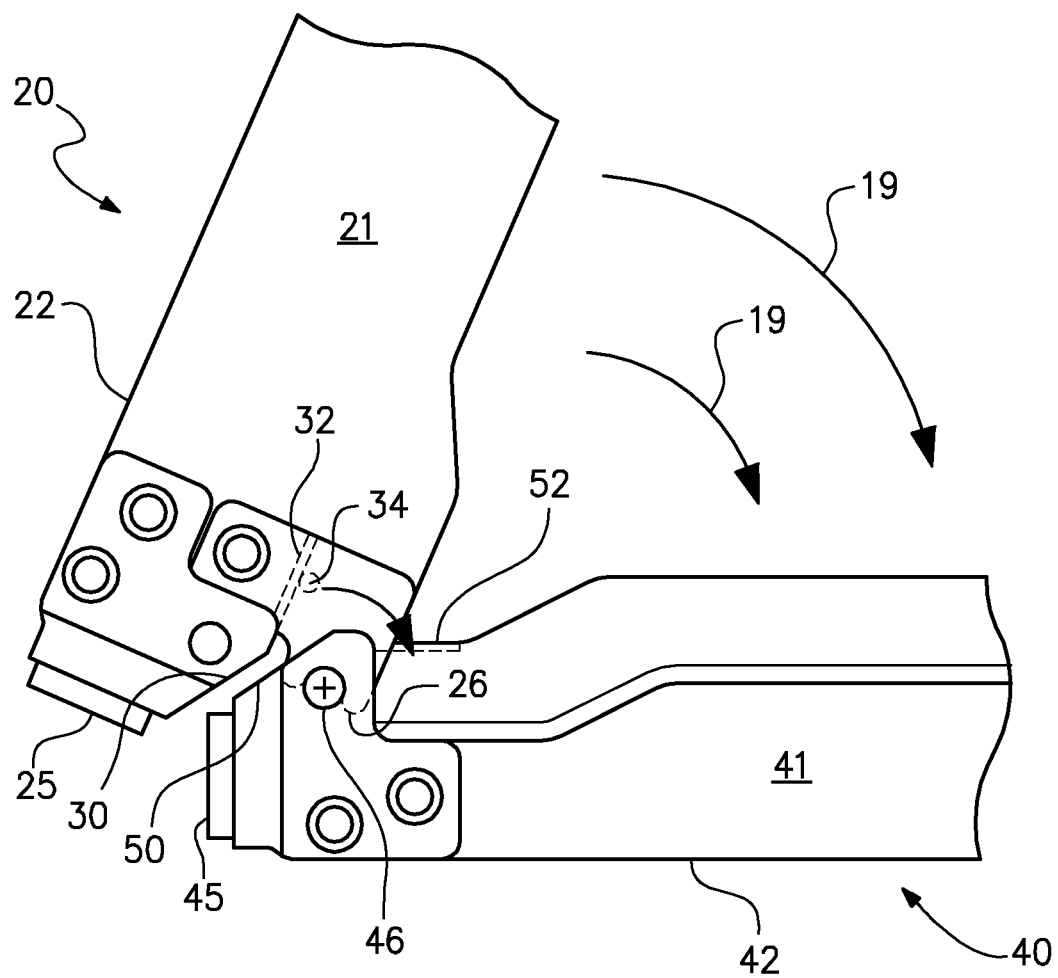
FIG. 4 is a side view of the hinged housing portions in an open position.

FIG. 4 is a side view of the first housing portion 20 and the second housing portion 40 in an open condition. The first hinge member 26 on the first side 21 of the first housing portion 20 is pivotally engaged with the third hinge member 46 on the third side 41 of the second housing portion 40. As shown by the arched arrows 19, the first housing 20 may be pivoted about the third hinge member (pin) 46 defining a pivot axis 18.

From the side view of FIG. 4, it should be emphasized that a first bevel 30 in the first bezel portion 25 and a second bevel 50 in the second bezel portion 45 allow the first housing portion 20 to reach the open position relative to the second housing portion 40. If the first and second bezel portions 25, 45 had square corners along the interface there between, attempts to pivot the first and second housing members 20, 40 would be unsuccessful without having a significant distance there between. Such a distance between the bezels would form an opening that would provide unacceptable electromagnetic shielding. Rather, the bezels 25, 45 provide electromagnetic shielding along the proximal end of the first and second housing portions 20, 40. Furthermore, a portion of each bezel 25, 45 extends distally from the beveled portion 30, 50 to form respective plates 32, 52. One of the plates 32, 52 (here, plate 32) secures a compressible electromagnetic seal material 34.

Figure 5:
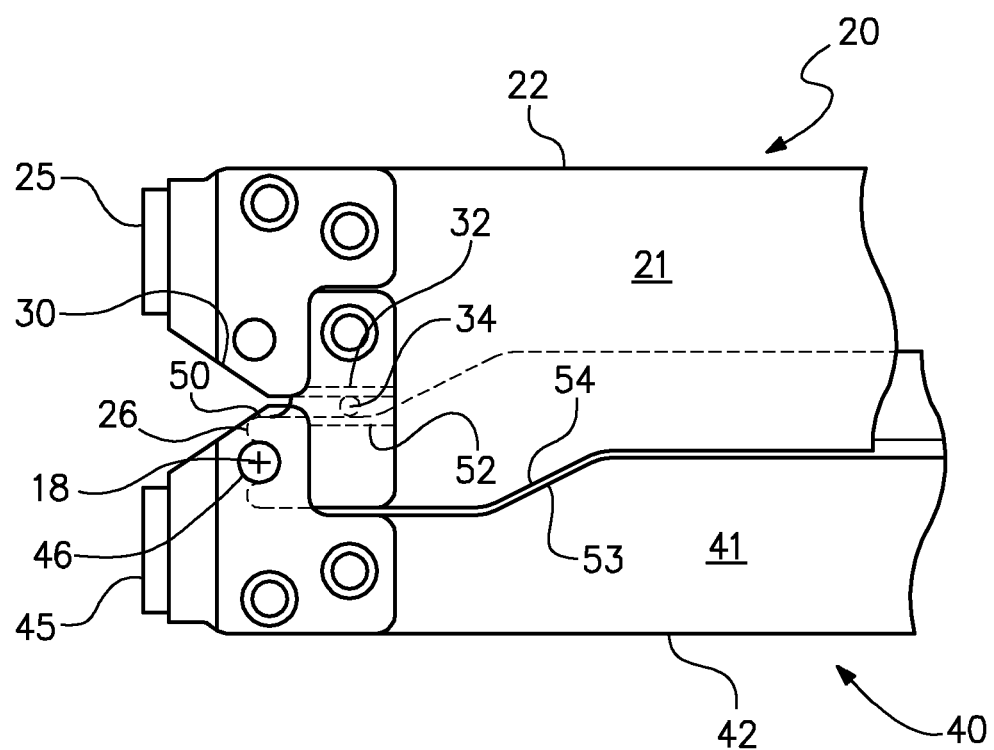
FIG. 5 is a side view of the housing portions in a closed position.

FIG. 5 is a side view of the first housing portion 20 and the second housing portion 40 in a closed condition. Accordingly, the first and second bezel portions 25, 45, with their respective beveled portions 30, 50 and distally extending plates 32, 52 provide electromagnetic shielding for the housing. Furthermore, the remaining small gap between the two plates 32, 52 is filled by the compressible electromagnetic seal material 34, which may be compressed to conform to any small dimensional deviations in the plates or the housing portions, generally. Briefly referring back to FIG. 1, the first plate 32, the second plate 52, and the compressible electromagnetic seal material 34 can be seen extending fully from side-to-side of the respective housing portions. The hinge members and the interface between the first and second bezel portions maintain electromagnetic shielding for the blade server.

Between the views in FIGS. 4 and 5, it can be seen that, when the housing portions are in the closed position of FIG. 5, the first side 21 of the first housing portion 20 overlaps the third side 41 of the second housing portion 40. This improves the strength of the closed housing, but it also provides full electromagnetic shielding along the sides of the housing. It should be appreciated that the second side 23 and the fourth side 43 may be the minor images of the sides 21, 41 shown in FIG. 5, and overlap in the same manner.

It should be further appreciated, that the blade server is operable in the closed condition. Accordingly, embodiments of the invention may include a latch to keep the two housing portions closed. Such a latch may, for example, be disposed at the distal end of the housing portions. Even though the hinge members are easily separated in the open position, the hinges members will not separate in the closed position. For example, as shown in FIG. 5, the first hinge member 26 will not life straight up and the first side 21 overlaps the third side 41 such that it will not move distally due to the edge 54 engaging the shoulder 53 (see also FIG. 3). As a result, the only way to disengage the hinge members 26, 46 is to unlatch the first housing portion 20 from the second housing portion 40, pivot the first housing portion 20 to the open position, then lift the first housing portion 20 (opposite the arrow 14 in FIG. 3).

Figure 6:
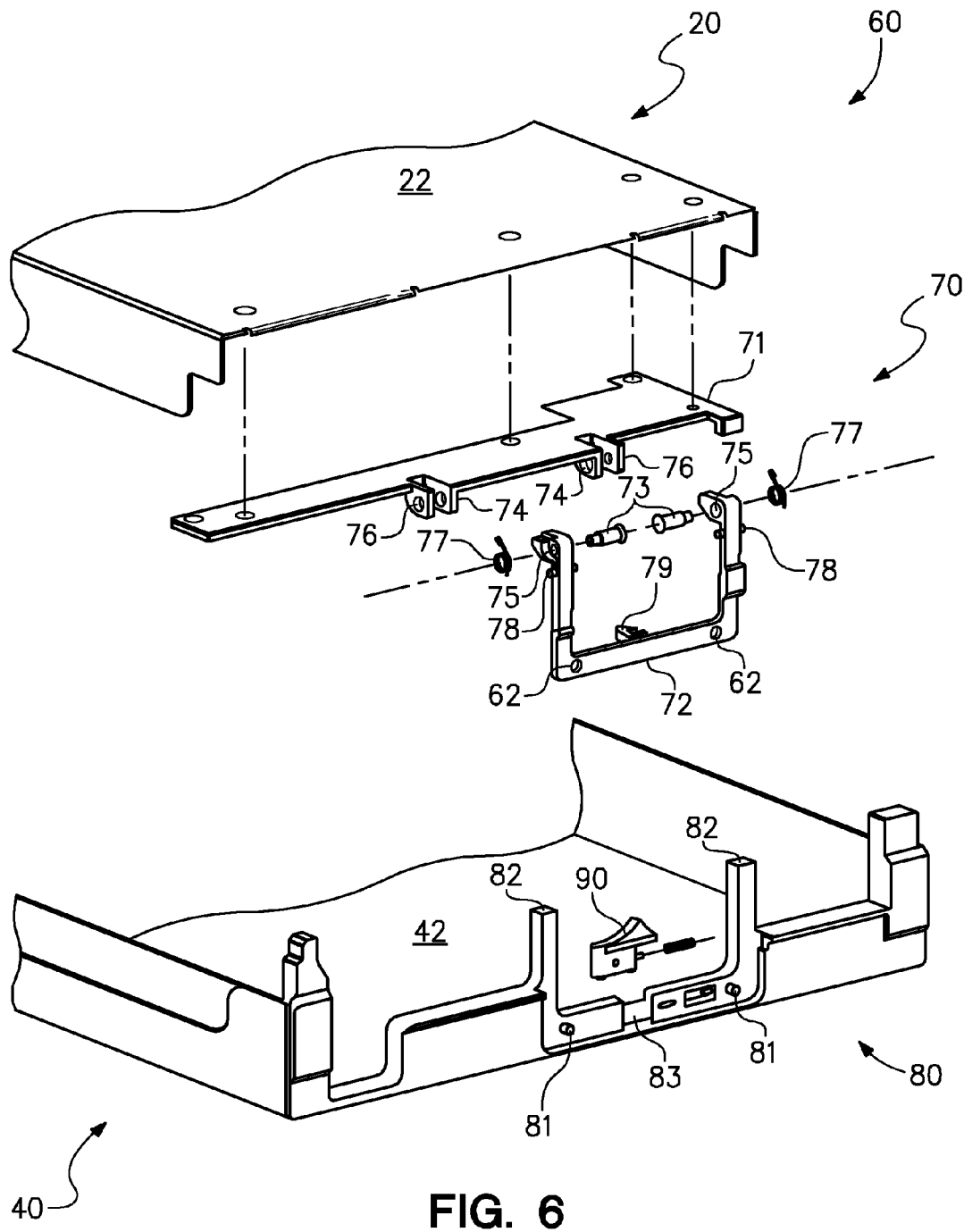
FIG. 6 is an assembly view of a latch secured to a distal end of the housing portions.

FIG. 6 is an assembly view of a latch assembly 60 secured to a distal end of the housing portions 20, 40. The latch assembly 60 includes a handle assembly 70 and a bulkhead 80.

The handle assembly 70 includes a stiffener plate 71 for securing to the first housing cover 22 and a handle 72 that is pivotally secured to the stiffener plate 71. A pair of hinge pins 73 each extend through a first hole 74 in the stiffener plate, then through a pivot hole 75 in the handle 72, and then through a second hole 76 in the stiffener plate. A torsion spring 77 is preferably also receive about the hinge pin 73 with one end engaging the stiffener plate 71 or the cover 22 and the other end engaging an adjacent portion of the handle 72. Still further, the handle 72 includes a cross member between the two arms, with a hook 79 extending from the handle, and two alignment holes 62.

The bulkhead 80 is secured to the second housing portion 40 at the distal end of the housing portion. The bulkhead 80 includes alignment pins 81, a pair of cam surfaces 82, and a spring bolt 90 that is slidably secured in a transverse slot 83 formed in the bulkhead. Greater detail of the bulkhead 80 is provided in the discussion of FIG. 8, below.

Figure 7A:
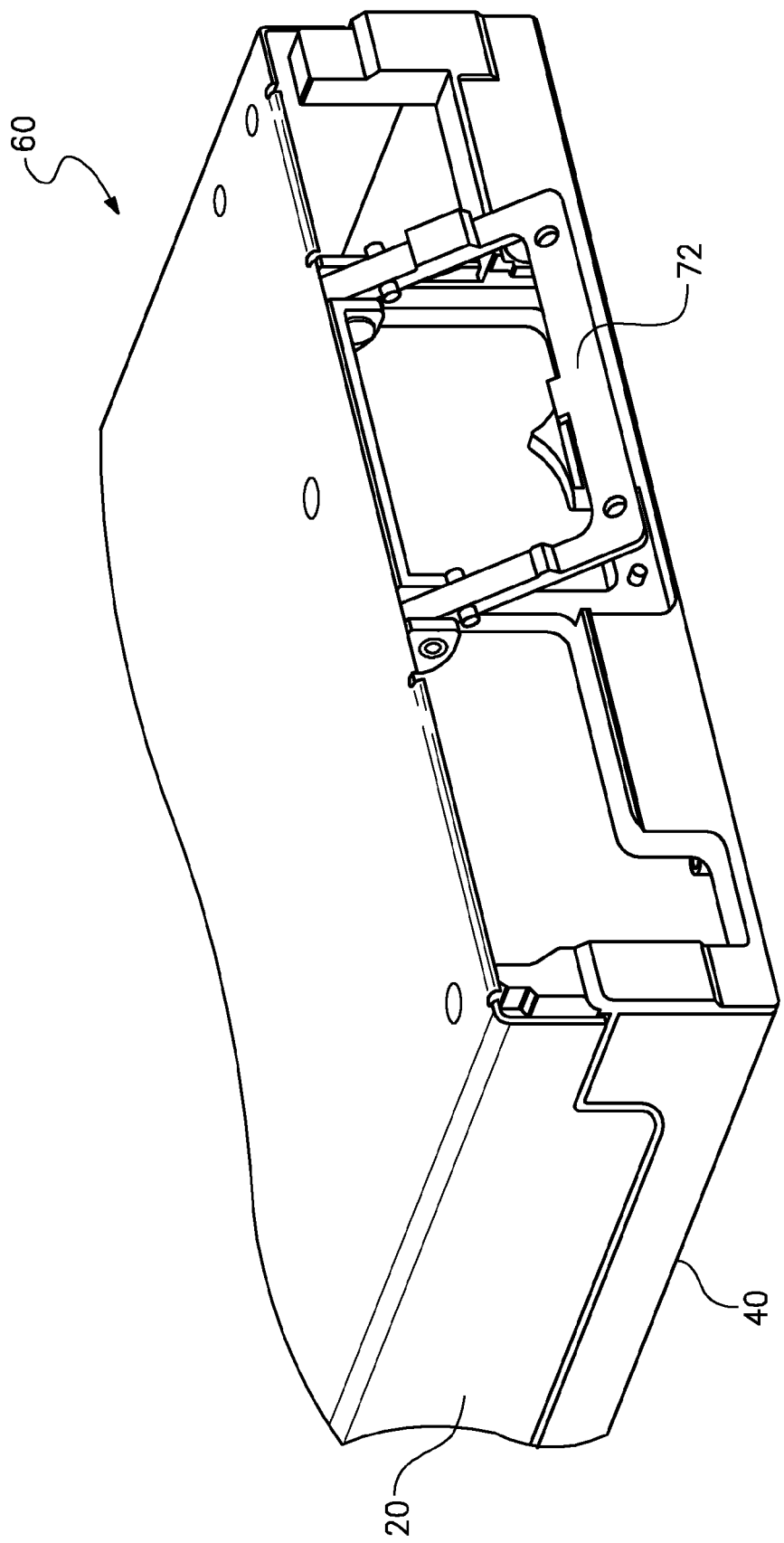
FIG. 7A is perspective view of the latch with the housing portions in a nearly-close, unlatched position.

FIG. 7A is perspective view of the latch assembly 60 after the parts have been fully assembled in accordance with FIG. 6. Furthermore, the housing portions 20, 40 are shown in a nearly-closed, unlatched position. While the printed circuit board assemblies (See 24, 44 in FIG. 1) are not shown, they are disposed face-to-face between the two housing portions 20, 40. The handle 72 is supported by the torsion spring (not shown; see FIG. 7B) in this open position, which preferably positions that handle at about a 30 degree angle relative to the closed position. In this open position, the handle serves as a visual indication that the housing portions may not be closed and certainly that the latch has not been secured. The open position also makes the handle easy for a user to grab with their hand.

Figure 7B:
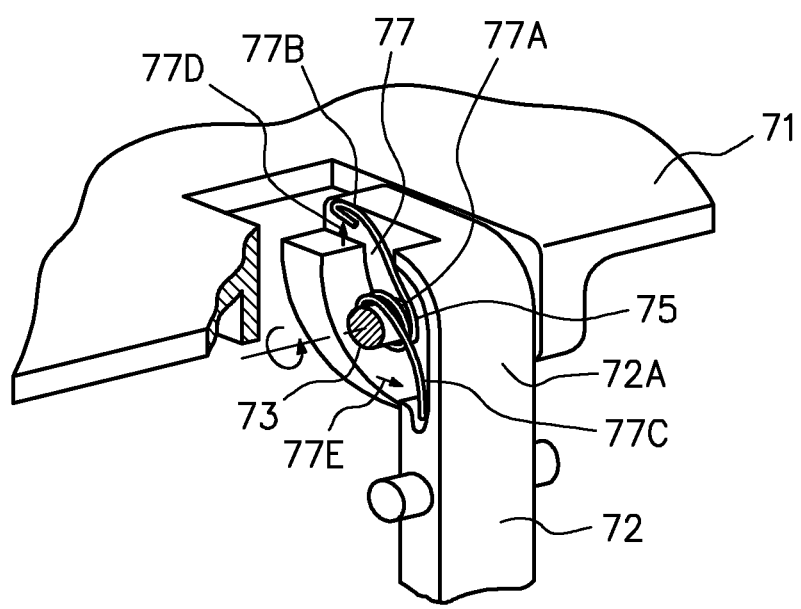
FIG. 7B is a partially cut-away, perspective view of one end of a handle coupled to a stiffener plate by a hinge pin.

FIG. 7B is a partially cut-away, perspective view of one end 72A of the handle 72 coupled to stiffener plate 71 by the hinge pin 73. A portion of the stiffener plate 71 and the hinge pin 73 have been cut-away for the purpose of revealing the torsion spring 77. The torsion spring 77 has a coil 77A received about the hinge pin 73, a first end 77B engaging the stiffener plate 71 or the cover 22 (not shown) and a second end 77C engaging an adjacent portion of the handle 72. Accordingly, the torsion spring 77 applies a force against the stiffener plate or cover (see arrow 77D) and a force against the handle (see arrow 77E) when the handle 72 is closed such that the torsion spring 77 is loaded. A preferred torsion spring 77 will bias the handle 72 to an open position of about 30-degrees of rotation (see FIG. 7A) when the handle is not latched, yet allow a user to easily overcome the spring force to close the handle.

Figure 8:
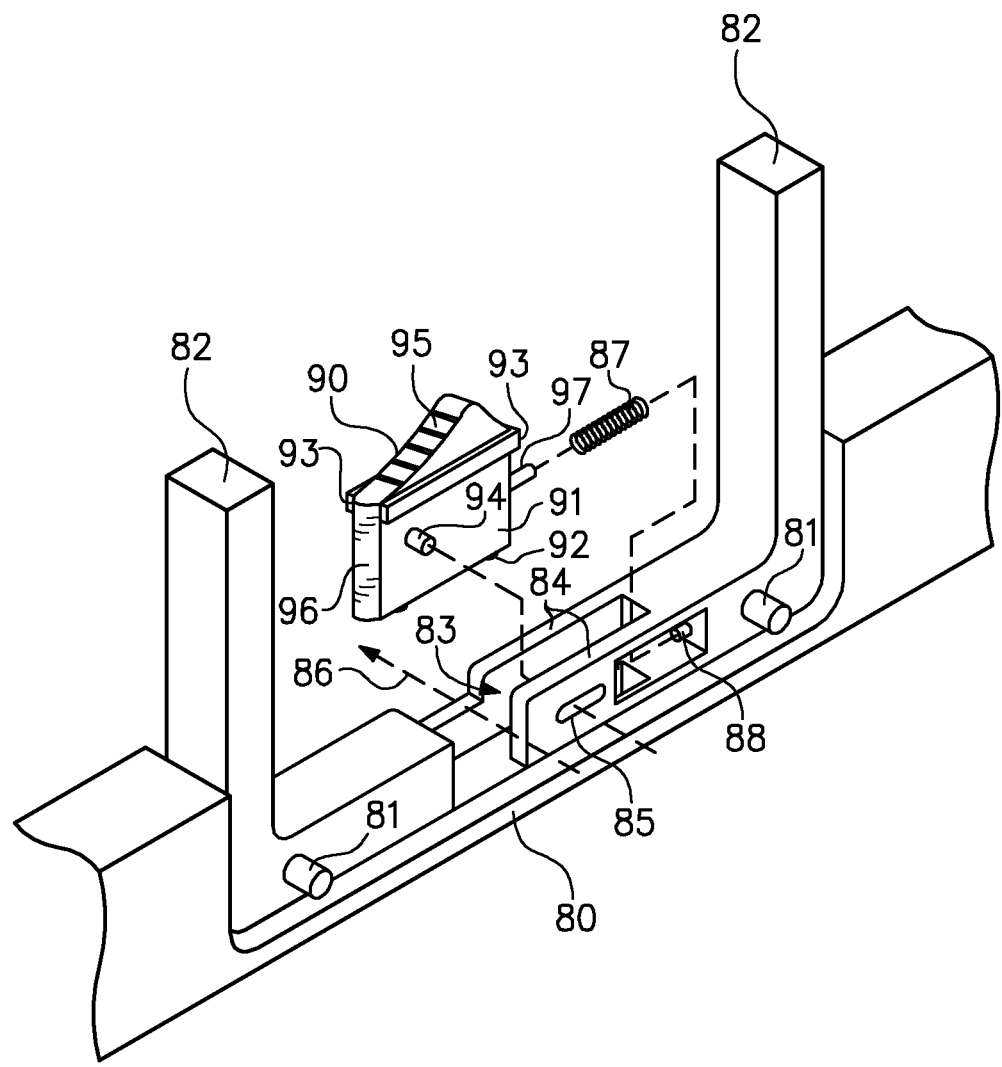
FIG. 8 is a perspective assembly view of a spring-bolt and its guide slot.

FIG. 8 is a perspective assembly view of a spring-bolt 90 and its guide slot 83, consistent with FIG. 6. The spring-bolt 90 has a narrow lower body 91 that slides within the guide slot 83 on a pair of round sliders 92. A wider flange body 93 extends across the top of the spring-bolt 90 and slides across the surfaces 84 on either side of the slot 83. A retainer pin 94 extends from the side of the lower body 91 and operably slides within a retainer slot 85 in the side of the slot 83. The retainer pin 94 keeps the spring-bolt 90 within the slot, and limits the range of travel of the spring-bolt 90 within the slot. The top surface of the spring-bolt 90 forms a finger trigger 95 that allows a user to retract the spring-bolt 90 when it is desired to release the handle 72 (not shown; see FIG. 6). A beveled surface 96 of the spring-bolt 90 extends into a pathway 86 of the hook 79 (not shown; see FIG. 6). Still further, the spring-bolt 90 has a spring retainer pin 97 for receiving a first end of a compression spring 87. The second end of the spring 87 is received on a spring retainer pin 88 within the slot 83. As can be seen, the compression spring 87 will bias the spring-bolt 90 toward the extended-most position of its range of travel (left as shown in FIG. 8). For perspective, FIG. 8 further shows the cam surfaces 82 and two pins 81.

Figure 9A:
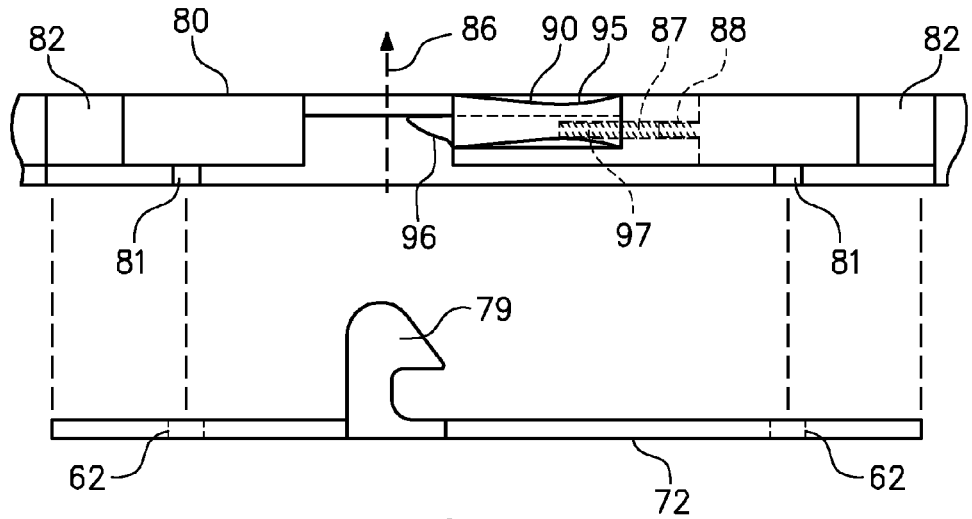
FIGS. 9A-9C are plan views of the latch handle approaching the base.
Figure 9B:
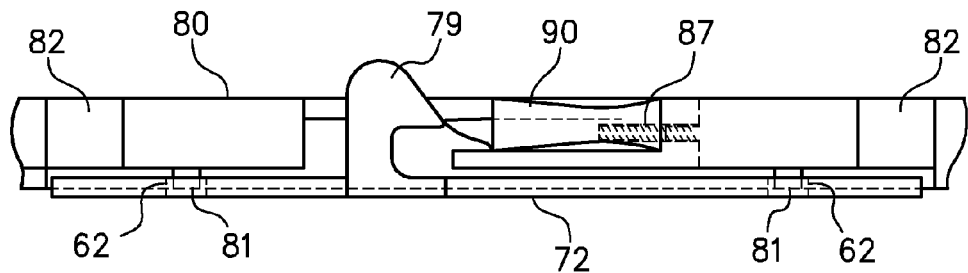
Figure 9C:
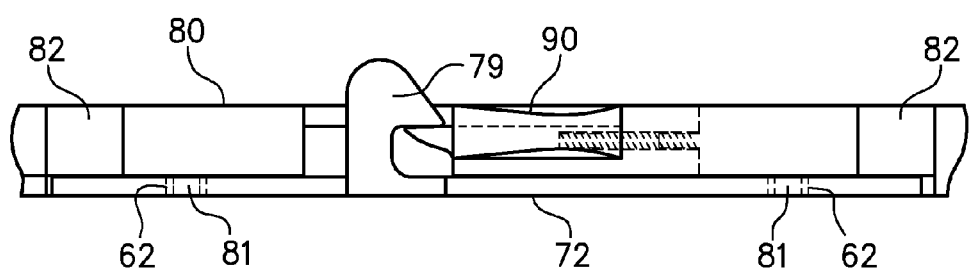

FIGS. 9A-9C are plan views of the handle 72 approaching the bulkhead 80. In FIG. 9A, the handle 72 pivots into a position where the alignment holes 62 are aligned with the alignment pins 81 on the bulkhead 80, and the hook 79 is aligned with the pathway 86 to engage, and eventually latch with, the spring-bolt 90. In FIG. 9B, the handle 72 has been pushed further toward the bulkhead 80, such that the alignment pins 81 have entered the alignment holes 62 and the beveled surface on the hook 79 has pushed against the beveled surface 96 of the spring-bolt 90 and caused the spring-bolt 90 to retract within the slot 83, overcoming the spring force and compressing the spring 87. In FIG. 9C, the handle 72 has reached a closed position against the bulkhead 80. Accordingly, the hook 79 has moved to a point that no longer retracts the spring-bolt 90, such that the spring 87 pushes the spring-bolt 90 back to the extended position (left in FIGS. 9A-9C). With the hook 79 latched as shown in FIG. 9C, the handle 72 cannot open. Further, when the handle 72 is latched closed, the first and second housings are unable to open. In order to release the handle 72, a user should manually move the spring-bolt 90 away from the hook 79 (to the right in FIG. 9C). Once the spring-bolt 90 has been moved out of alignment with the hook 79, the handle 72 is released and will automatically spring open, such as to the open position shown in FIG. 7A.

FIG. 10A is an elevation view of the distal ends of the first and second housing portions 20, 40 in a nearly-closed position. The position is "nearly-closed", and not fully closed (or simply "closed), because the handle 72 does not extend a sufficient distance (downwardly in FIG. 10A) in order for the alignment pins 81 of the bulkhead 80 to be received within the alignment holes 62 in the handle 72. Accordingly, the handle 72 cannot move into the positions of FIGS. 9B or 9C. The handle 72 does not extend far enough because the first and second housing portions 20, 40 are not closed. At points 99 it can be seen that the first housing cover 22 is still raised slightly. Furthermore, a conductive component (socket) 100 on the first printed circuit board assembly 24 has not fully received a conductive component (mezzanine card) 102 on the second printed circuit board assembly 44. Under this condition, the interconnection between the components 100, 102 is not the full wipe and the connection maybe noisy or unreliable. It should also be appreciated that since the handle is not latched in the closed position, the torsion spring will cause the handle to be in an open position as described in relation to FIGS. 7A and 7B, above.

FIG. 10B is an elevation view of the housing portions 20, 40 latched in a closed position. Looking at the points 99, it can be seen that first housing cover 22 has moved down. With the housing portions closed, the alignment pins 62 in the handle 72 now align with, and can receive, the alignment pins 81 of the bulkhead 80. Accordingly, the hook (not shown) may now engage the spring-bolt 90 and become latched as shown previous in FIGS. 9B-9C. Furthermore, the wipe between the components 100, 102 is now sufficient to make a reliable electronic connection. This view of the distal end of the housing portions in FIG. 10B corresponds to the view of the proximal end of the housing portions in FIG. 5

Figure 11:
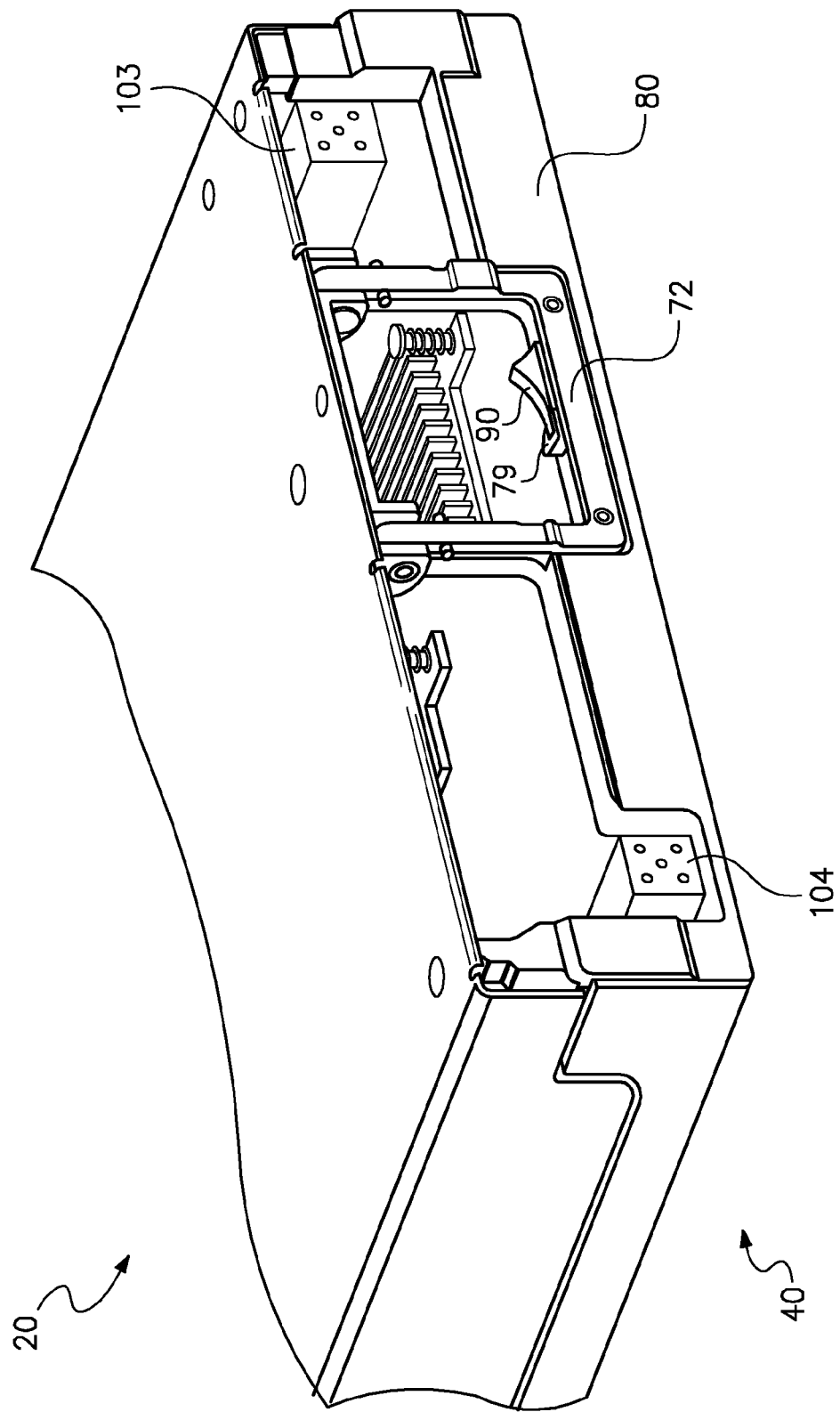
FIG. 11 is a perspective view of the housing portions latched in the closed position.

FIG. 11 is a perspective view of the first and second housing portions 20, 40 latched (see hook 79 latched by spring-bolt 90) in the closed position as was shown in FIG. 10B. Also shown in FIG. 11, there are connectors 103, 104 on the first and second printed circuit board assemblies of the first and second housing portions 20, 40 that are accessible through the bulkhead 80. The connectors 103, 104 may be connected to external components, such as external power sources or network switches. For example, the connectors 103, 104 may blind mate with a midplane of a multi-server chassis.

Figure 12B:
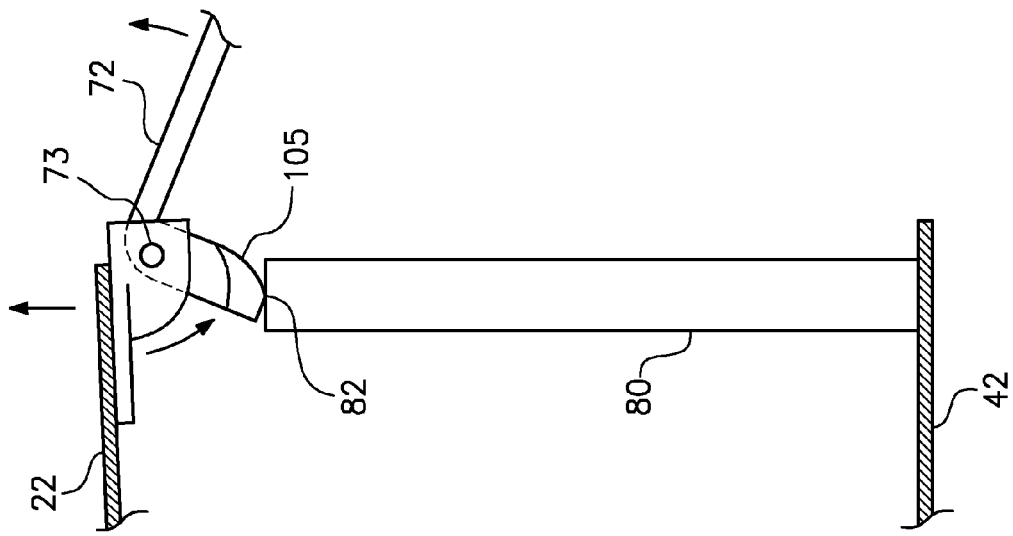
FIGS. 12A and 12B are partial cross-sectional side views of a handle using its cam to open the housing portions.
Figure 12A:
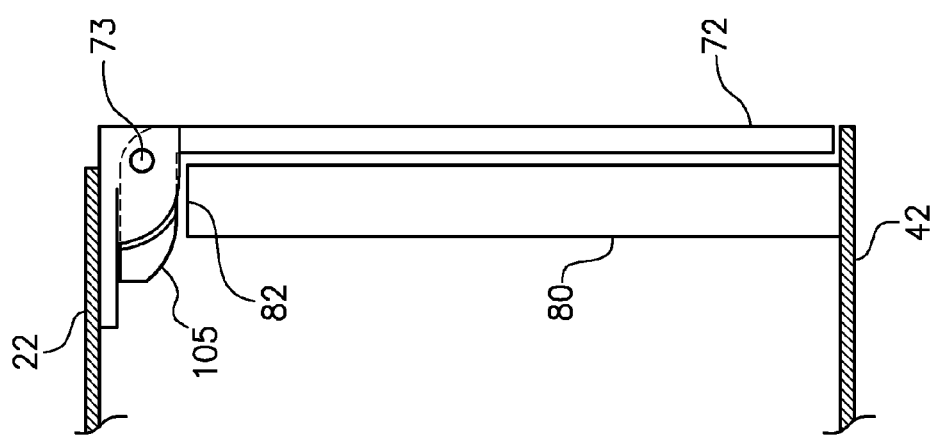

FIGS. 12A and 12B are partial cross-sectional side views of a handle 72 using its cam 105 to open the housing portions 20, 40 with a leveraged force that may be used to disengage the connected components 100, 102 of the printed circuit board assemblies (not shown; see FIG. 10B). In FIG. 12A, the housing portions are closed and the handle 72 is latched. The cam 105 extends at approximately a 90-degree angle to the handle 72 and has a cam surface that faces toward the cam surfaces 82 of the bulkhead 80. The handle 72 is shown pivotally coupled to the cover 22 about the pivot pin 73. In FIG. 12B, the handle 72 has been unlatched and manually lifted to the point shown. As a result, the cam 105 has engaged the cam surface 82 with a force that causes a upward reactionary force on the pivot pin 73. The result of the reactionary force is that the cover 22 rises and any components (for example components 100, 102 of FIG. 10B) connected between the printed circuit board assemblies will be disconnected.

Embodiments of the present invention provide various advantages over alternative double-dense blade servers. Having two bezel portions means that the controls, indicators and front-accessible component can be pre-installed and tested. The hinge members are intuitive and easy to use. The printed circuit board assemblies are protected by each housing portion having two sides that extend toward the other housing portion, preferably a distance greater than the height of the tallest component on the printed circuit board assembly. Furthermore, the collection of features provides more robust electromagnetic shielding.

Embodiments of the invention may assure positive connections between the printed circuit board assemblies (for example, server nodes) and ensure that connectors between the printed circuit board assemblies are engaged with sufficient wipe. Both the hinge members and the latch may be easy to use tool-less designs that also avoid airflow restrictions into and out of the housing.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus, comprising:
   a housing including a first housing portion and a second housing portion coupled at a first end;
   a bulkhead secured to a second end of the second housing portion, wherein the bulkhead includes a distally extending pin and a spring latch;
   a handle pivotally secured to a second end of the first housing portion, wherein the handle has a hole that is sized and positioned to selectively receive the distally extending pin and allow the handle to close only with the first and second housing portions in a closed position, and wherein the handle has a hook that is captured by the spring latch in response to the handle being closed.

2. The apparatus of claim 1, further comprising:
   a first printed circuit board assembly secured to the first housing portion; and
   a second printed circuit board assembly secured to the second housing portion.

3. The apparatus of claim 2, further comprising:
   a first component secured to the first printed circuit board assembly, wherein the first component has a first conductive connector; and
   a second component secured to the second printed circuit board assembly, wherein the second component has a second conductive connector, wherein the first conductive connector is aligned for operative engagement with the second conductive connector with the first and second housing portions in a closed position.

4. The apparatus of claim 3, wherein the handle has a cam surface, wherein pivoting the handle from the closed position toward an open position causes the cam surface to engage the bulkhead, move the first and second housing portions out of the closed position, and disengage the first and second conductive connectors.

5. The apparatus of claim 1, wherein the first and second housing members are coupled at the first end by a first hinge member formed on the first housing member and a second hinge member formed on the second housing member.

6. The apparatus of claim 1, further comprising:
   a spring biasing the handle toward an open position.

7. The apparatus of claim 1, wherein the handle has two arms that are both pivotally secured to the second end of the first housing portion.

8. The apparatus of claim 7, wherein the handle has a crossmember secured between the distal ends of the two arms, and wherein the region between the two arms, the second housing member and the crossmember is open for the flow of exhaust air from the housing.

9. The apparatus of claim 1, wherein the spring latch is slidably received within a slot in the bulkhead.

10. The apparatus of claim 1, wherein the spring latch includes a finger trigger for retracting the spring latch to release the handle.

11. The apparatus of claim 2, wherein at least one of the first and second printed circuit board assemblies has a component that is accessible through the second end of the housing for connection with an external component.

12. The apparatus of claim 11, wherein the external component is a midplane of a multi-server chassis.

* * * * *